United States Patent
Furukawa et al.

(10) Patent No.: US 6,891,235 B1
(45) Date of Patent: May 10, 2005

(54) FET WITH T-SHAPED GATE

(75) Inventors: Toshiharu Furukawa, Essex Junction, VT (US); Mark Charles Hakey, Fairfax, VT (US); Steven John Holmes, Milton, VT (US); David Vaclav Horak, Essex Junction, VT (US); Edward Joseph Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 506 days.

(21) Appl. No.: 09/713,830

(22) Filed: Nov. 15, 2000

(51) Int. Cl.$^7$ .............................................. H01L 29/76
(52) U.S. Cl. ...................................................... 257/408
(58) Field of Search .............................. 257/288, 327, 257/335, 336, 412, 913, 408, 210, 211, 344

(56) References Cited

U.S. PATENT DOCUMENTS

| | | | |
|---|---|---|---|
| 4,570,328 A | * | 2/1986 | Price et al. |
| 5,356,821 A | * | 10/1994 | Naruse et al. |
| 5,650,342 A | | 7/1997 | Satoh et al. .................. 437/36 |
| 5,650,343 A | | 7/1997 | Luning et al. ................ 437/36 |
| 5,750,430 A | | 5/1998 | Son ............................. 438/303 |
| 5,937,319 A | | 8/1999 | Xiang et al. ................. 438/585 |
| 5,981,383 A | * | 11/1999 | Lur et al. |
| 5,990,532 A | * | 11/1999 | Gardner |
| 5,998,289 A | * | 12/1999 | Sagnes |
| 6,015,724 A | | 1/2000 | Yamazaki .................... 438/151 |
| 6,037,630 A | | 3/2000 | Igarashi et al. ............. 257/336 |
| 6,087,248 A | * | 7/2000 | Rodder |
| 6,124,177 A | * | 9/2000 | Lin et al. |
| 6,284,613 B1 | * | 9/2001 | Subrahmanyam et al. |
| 6,306,710 B1 | * | 10/2001 | Long et al. |
| 6,528,848 B1 | * | 3/2003 | Hoshino et al. |
| 6,608,356 B1 | * | 8/2003 | Kohyama et al. |

FOREIGN PATENT DOCUMENTS

| | | | | |
|---|---|---|---|---|
| FR | WO 00/57461 | | 9/2000 | ........... H01L/21/28 |
| JP | 10294453 A2 | | 4/1997 | ........... H01L/29/78 |

OTHER PUBLICATIONS

"100 nm Gate Length High Performances / Low Power CMOS Transistor Structure" T. Ghani et al., 1999 IEEE, 0–7803–5413–Mar. 1999, IEDM 99 pp. 415–418.

"Well–controlled selectively under–etched Si/SiGe gates for RF and high performance CMOS" T. Skotnicki et al., 2000 Symposium on VLSI Technology Digest of Technical Papers, 2000 IEEE, pp. 156–157.

PCT International Search Report.

* cited by examiner

*Primary Examiner*—Nathan J. Flynn
*Assistant Examiner*—Kevin Quinto
(74) *Attorney, Agent, or Firm*—Anthony J. Canale (57) ABSTRACT

An FET has a T-shaped gate. The FET has a halo diffusion self-aligned to the bottom portion of the T and an extension diffusion self aligned to the top portion. The halo is thereby separated from the extension implant, and this provides significant advantages. The top and bottom portions of the T-shaped gate can be formed of layers of two different materials, such as germanium and silicon. The two layers are patterned together. Then exposed edges of the bottom layer are selectively chemically reacted and the reaction products are etched away to provide the notch. In another embodiment, the gate is formed of a single gate conductor. A metal is conformally deposited along sidewalls, recess etched to expose a top portion of the sidewalls, and heated to form silicide along bottom portions. The silicide is etched to provide the notch.

20 Claims, 12 Drawing Sheets

FET WITH T-SHAPED GATE

FIELD OF THE INVENTION

This invention generally relates to integrated circuit chips. More particularly it relates to field effect transistors (FET). Even more particularly it relates to an improved FET having a T-shaped gate.

BACKGROUND OF THE INVENTION

The speed of an FET is largely determined by the distance across the gate; transistors with a shorter gate conductor distance have a shorter spacing between source and drain and are generally faster. The industry has moved to photolithography equipment that provides a shorter wavelength of light and a higher numerical aperture lens with each generation of integrated circuits to permit decreasing this dimension of the gate. However, these changes have frequently increased cross chip line width variation. Furthermore, these changes have resulted in higher gate resistance.

U.S. Pat. No. 5,750,430, to Jeong-Hwan Son describes a gate having curved sidewalls produced by depositing polysilicon for the gate in a window between spacers. The transistor has a larger dimension at the top than at the bottom. It provides a channel length that is shorter than the minimum dimension and reduced overlap capacitance. An FET with a notch at the bottom of the poly gate was described in a paper "100 nm Gate Length High performance/Low Power CMOS Transistor," by T. Ghani et al, Technical Digest of the 1999 International Electron Devices Meeting, Washington, D.C., 1999, p 415. The notch offsets the source-drain-extension implant and provides a shorter gate dimension with improved capacitance and also avoids increasing resistance since the gate has a larger overall cross sectional area.

The spacer defined gate with the curved sidewalls and the notched gate provide advantage but substantial further device performance improvement is possible. This improvement may be derived by modifying the structures described in the '430 patent and the paper by T. Ghani. The new structures and processes to achieve those new structures are provided by the following invention.

SUMMARY OF THE INVENTION

In one aspect, the present invention is an FET comprising a gate having a top portion having a top dimension and a bottom portion having a bottom dimension. The top dimension is larger than the bottom dimension. The FET further comprises a diffusion defined by the bottom portion.

The FET can also include a diffusion defined by the top portion. The diffusion defined by the bottom portion may be a halo implant and the diffusion defined by the top portion may be an extension implant.

Another aspect the invention is accomplished by an FET comprising a gate that includes a first conductive material under a second conductive material different from said first conductive material. The first conductive material is notched.

Another aspect the invention is a method of fabricating a semiconductor device. The method includes the step of providing a substrate formed of a first material. The substrate has a surface. The next step is forming a gate dielectric on the surface. Then a gate is deposited on the gate dielectric. The gate comprises a first gate layer and a second gate layer, wherein the first gate layer contacts the gate dielectric and the second gate layer is on the first gate layer. The next step is chemically reacting edges of the first gate layer to form a first reaction product. Finally, the method involves selectively removing the first reaction product with respect to remaining portions of the first gate layer and the second gate layer so as to provide a notch in the first gate layer.

BRIEF DESCRIPTION OF THE DRAWINGS

The foregoing, and other features and advantages of the invention will be apparent from the following detailed description of the invention, as illustrated in the accompanying drawings, in which:

FIGS. 3b, 3c are cross sectional views showing process steps to provide a spacer and the source/drain implants for the a T-shaped gate of FIG. 3a;

FIGS. 3d, 3e are cross sectional views showing process steps to provide an air gap behind a spacer for a T-shaped gate of FIG. 3a;

FIGS. 4–6 show cross sectional views illustrating a process of fabricating the T-110 shaped gate of FIG. 3a.

DETAILED DESCRIPTION OF THE INVENTION

Halo, or pocket, implants are well known as a means of moderating short-channel effects in very short MOSFETs. Short channel effects include Vt lowering and subthreshold slope increase as gate length decreases. Halo formation is usually accomplished by implanting a dopant type opposite to the source/drain doping, (e.g. by implanting boron in NFETs). A high energy is used for the halo implant to move it under the gate beyond the extent of the source/drain extension implant, which usually have significantly lower energies and higher doses, as shown in Table 1. As a result the p-dopant of the halo is often placed deeper than the n-dopant of the source/drain diffusion. The n-type source drain diffusion is thus decorated with a p-type halo all around. While the p-type dopant in the channel region is helpful for short channel effect, the halo extending under the source/drain has the unfortunate effect of increasing source/drain junction capacitance. Note that in the description below, the phrase "(#) e (#)" is a shorthand notation for concentrations in powers of ten; thus, e.g. in the table below, "1e13" means $1 \times 10^{13}$.

TABLE 1

Parameters of Standard Halo, Extension, and Source/Drain Implants

| Implant purpose | Species | Type | dose (cm-2) | Dopant concentration (cm-3) | energy (kev) |
| --- | --- | --- | --- | --- | --- |
| halo | B | p | 1e13 to 8e13 | 5e18 to 2e19 | 2 to 20 |
| extension | As | n | 8e14 to 2e15 | 5e19 to 1e21 | 0.5 to 5 |
| source/drain | As | n | 5e15 to 1e16 | 5e19 to 1e21 | 3 to 35 |

Although a high energy is used to move the halo away from the source/drain and extension, typically the net p-dopant available for the halo is a small fraction of the total implanted p-dopant dose since most of the p implant falls within the more heavily doped source/drain and is compensated. Thus, the standard implant technique allows only limited halo concentrations to be achieved with reasonable control, and this limits the extent to which short channel effects are controlled. Furthermore, control over the halo carrier concentration is difficult because of the small fraction of p-type dopant atoms that are left uncompensated. Therefore small variation in the dose or energy of either the halo or the extension implant can provide large variation in the halo carrier concentration.

With the conventional halo, a change in halo carrier concentration of 10× is achieved over a distance of 70 to 100 A when the carrier concentration is in the 10e17 to 10e 18 range. This gradual rate of change of carrier concentration is the result of the compensation of the halo implant by the extension and source/drain implants. For improved short channel control a more abrupt change in carrier concentration is needed, such as by providing the same 10×change in carrier concentration over 30 to 40 A. In addition, for improved device performance the halo concentration below the source/drain can be reduced so as to reduce source/drain junction capacitance. The higher halo doping concentration provides a narrower depletion region which provides higher capacitance.

Figure 1A:
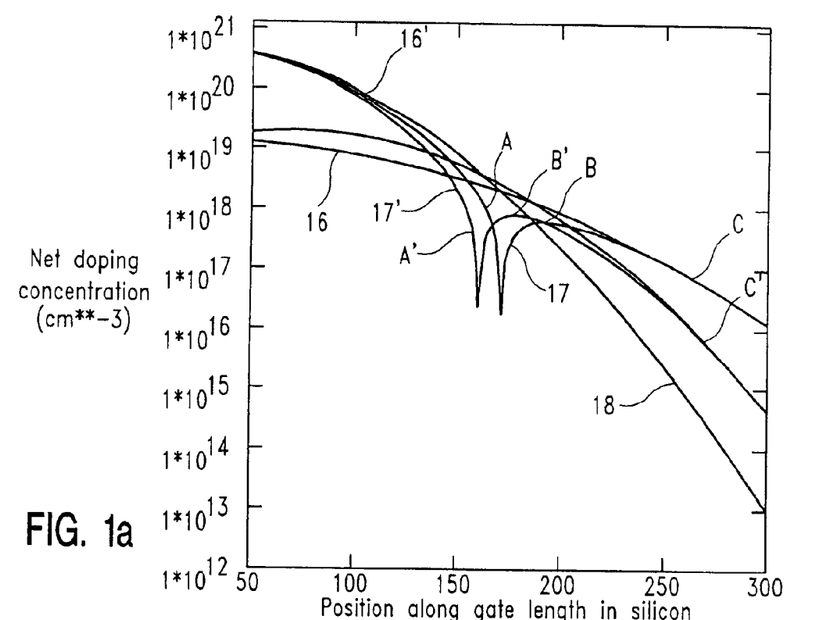
FIG. 1a are doping profiles of extension implants and halos for conventional and notched gate devices showing one side of the device.
Figure 1B:
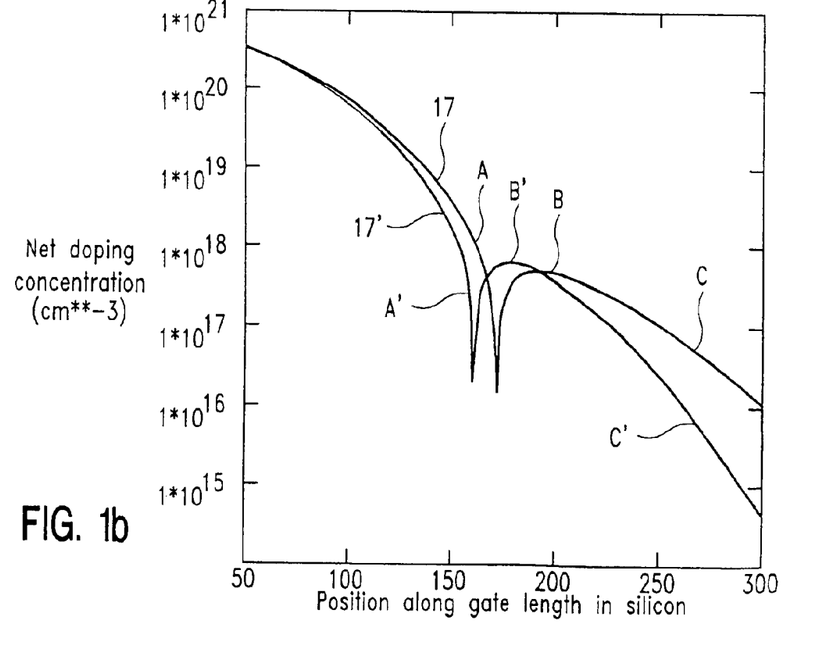
FIG. 1b are net compensated doping profiles of extension implants and halos for conventional and notched gate devices.

Two distinct changes can come from the notched gate. First, a lower energy halo implant can be used which provides less straggle, so a steeper halo profile results as shown by comparing curves 16 and 16' in FIG. 1*a*. Curve 16 is the conventional halo implant while curve 16' is the halo implant provided by using the notched gate of the invention as further described herein below. Curve 18 is the profile of the extension implant for both conventional and notched gate cases. Second, in the region where the halo implant is laterally spaced from the extension implant edge, the halo has a higher net doping concentration, as shown by points B and B' on curves 17 and 17', which provides a narrower depletion region in this zone. In addition because of the higher halo doping there is a more abrupt junction, as shown by points A and A' in FIGS. 1*a*, 1*b*. The narrower depletion region provides better short channel control of Vt. The doping profile at point A' on curve 17' is steeper than that at point A on curve 17, providing the ability to control channel potential with a shorter channel so as to be able to turn off the device.

Figure 2A:
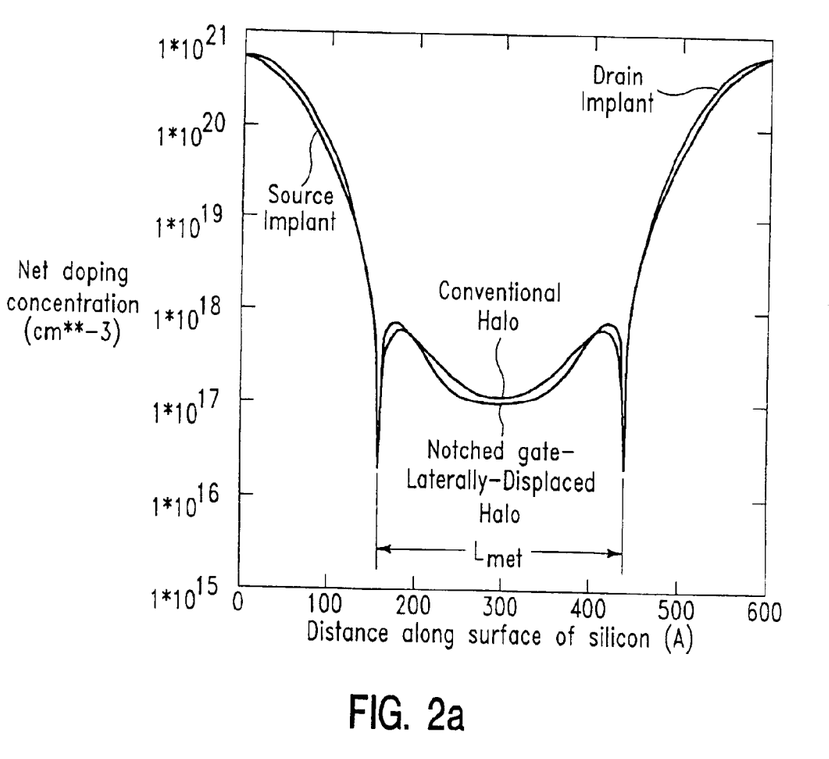
FIGS. 2a, 2b, 2c are net compensated doping profiles of extension implants and halos for conventional and notched gate devices of different channel lengths showing the full device, including source and drain.
Figure 2B:
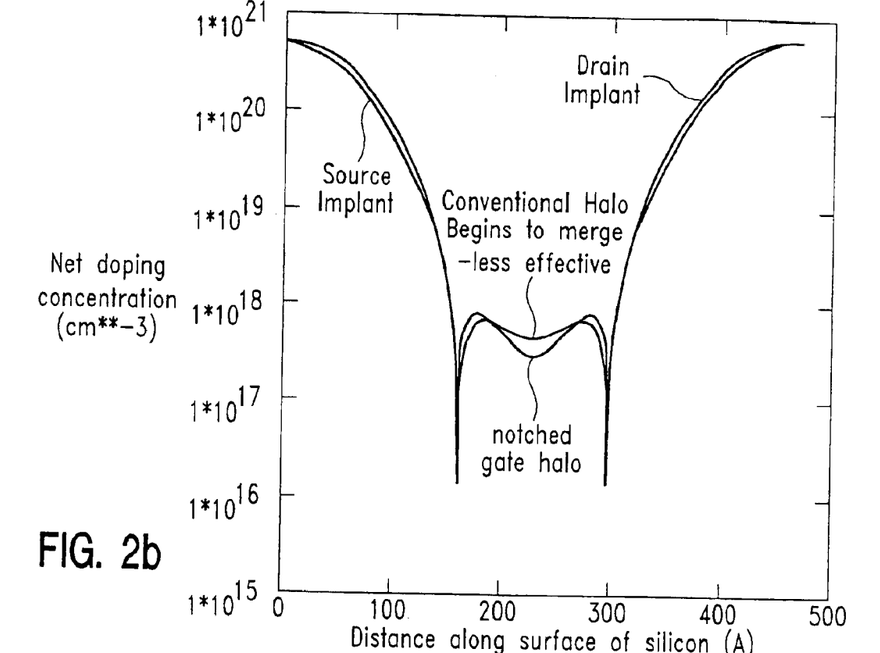
Figure 2C:
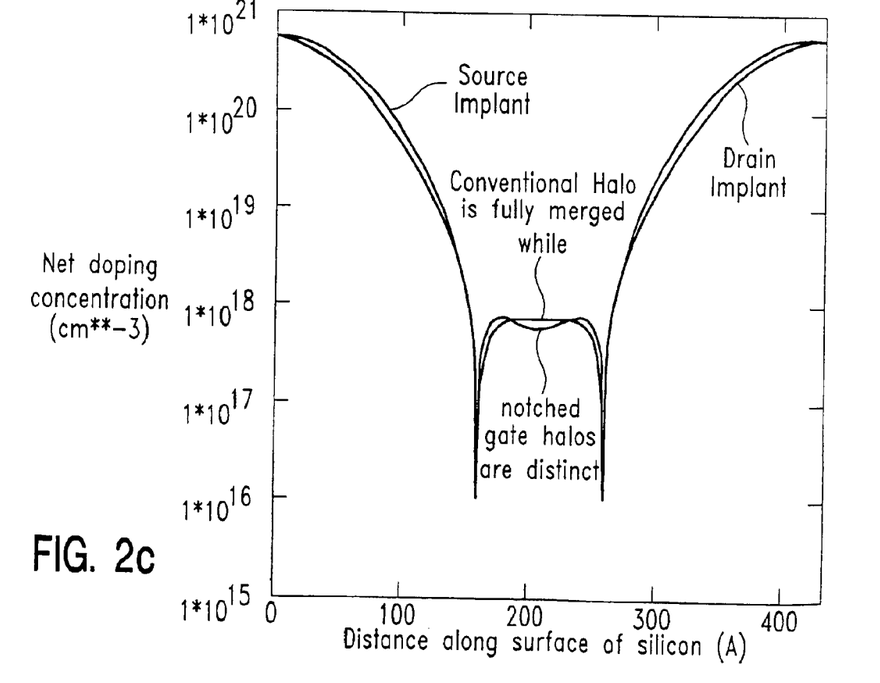

The halo doping profile at point C' on curve 17' can be steeper than that at point C on curve 17 because a lower energy implant and less diffusion can be used to form the halo with the notched gate. This provides less straggle and less dispersion of the halo, allowing better control over the linear Vt with shorter channel length. As shown in FIGS. 2*a*, 2*b*, and 2*c*, the steeper profile C' of the halo implant allows source and drain diffusions to be placed closer to one another before the two halos merge. This allows a shorter channel length to be provided with the same Vt control. Physically, FIGS. 2*a*, 2*b*, 2*c* differ only in the gate length. In FIG. 2*a*, both conventional and notched gate halos have distinct regions adjacent source and drain and are equally effective in Vt control. In FIG. 2*b*, the notched gate halo continues to provide distinct halos adjacent source and drain, the conventional halos are beginning to merge, providing less well controlled Vt. In FIG. 2*c*, the conventional halo is fully merged while the notched gate halo is now beginning to merge. Thus, a shorter channel can be achieved with good Vt control with the notched gate halo.

One way to separate the halo implant from the extension implant is to implant the halo at an edge of the gate, then to provide a spacer along sidewalls of the gate, and then to implant the source/drain extension. The spacer has a width of 10–20 nm, and that provides a spacing between the halo and the extension implants. While this method does provide the desired separation of halo from source/drain extension it has the disadvantage of requiring that the NFET extension block mask be used twice, once before and once after spacer formation. It also requires tight control of the width of the spacer to ensure repeatable halo and implant separation. The present invention improves upon this approach.

The process of the present invention provides for separating the halo and extension implants, the more abrupt junction, and greater control over the halo carrier concentration, by angle implanting the halo with an inverted T gate while providing the extension implant from a more vertical direction. The present invention thus allows the halo and extension implants to be laterally displaced from each without any masking steps between the implants. Thus, the extension block mask need only be provided once to provide both the halo and the extension. This separation of implants with a single mask is accomplished by first etching T-shaped gate 20 on semiconductor wafer 21. (The T-shaped gate can be formed using the process described herein below.)

Figure 3A:
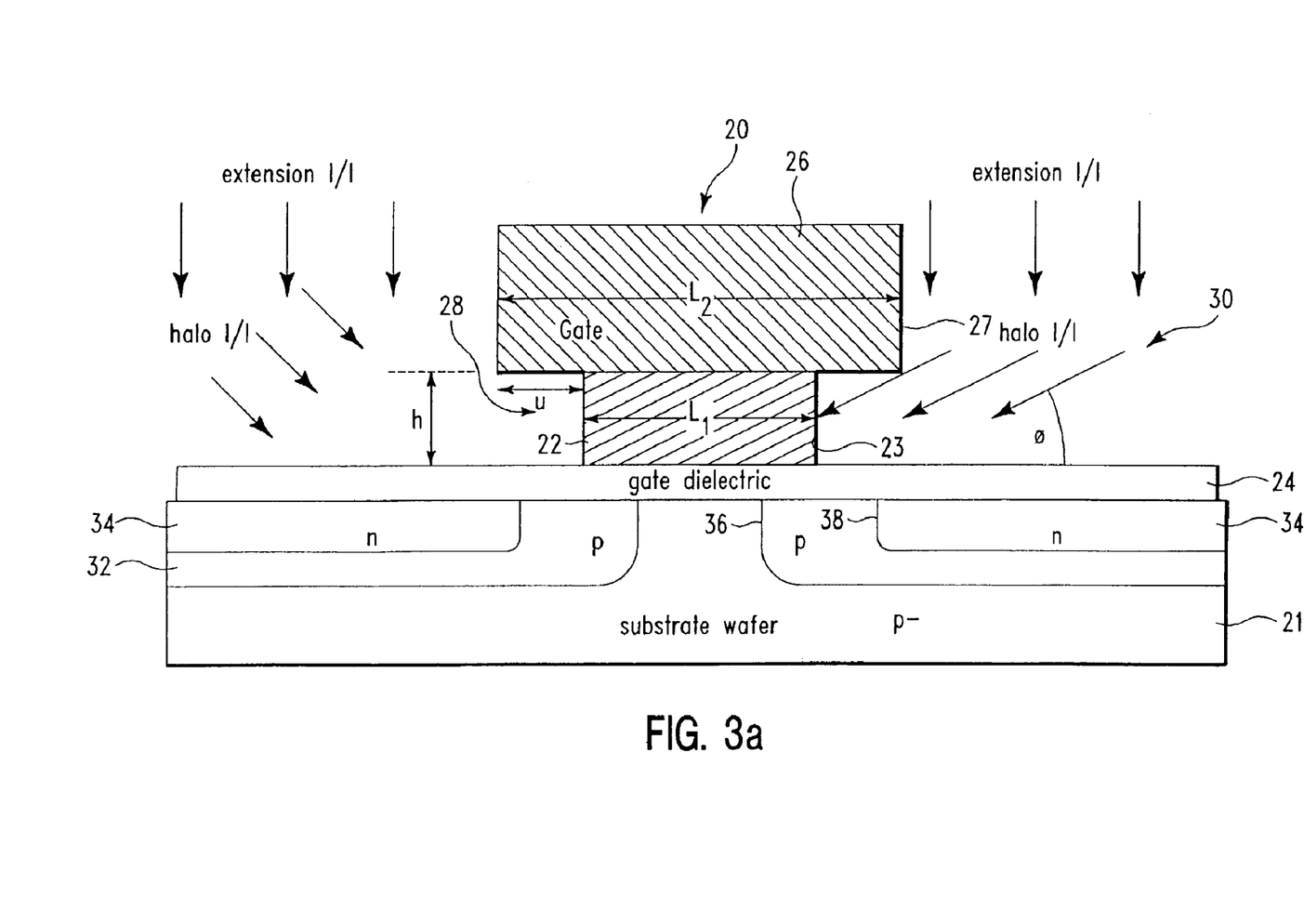
FIG. 3a is a cross sectional view of a T-shaped gate and showing that halo and extension implants are defined by different edges of the T.

As shown in FIG. 3*a*, T-shaped gate 20 has lower part 22 having dimension L, and edge 23 on gate dielectric 24. T-shaped gate 20 also has upper part 26 having dimension $L_2$ and edge 27 on lower part 22. Notch 28 is thereby defined having height h and lateral extent u where $u=(L_2-L_1)/2$. After T-shaped gate 20 has been formed, an extension block mask (not shown) is provided to block PFETS while NFET 30 is being formed.

P-type halo 32 is then implanting at an angle θ given by tan θ<h/u where h is the height of the notch and u is the lateral extent of the notch. Thus, halo 32 is defined by lower part 22 of T-shaped gate 20. Typically the angle implant for the halo is provided from all four cardinal directions to provide the implant for devices on the wafer of different orientation. Any particular device receives the implant in active area along two directions, as shown in FIG. 3*a*. Finally extension diffusion 34 is implanted at an angle normal to semiconductor wafer 21, so extension diffusion 34 is defined by edge 27 of larger upper part 26 of gate 20.

Thus, implant edge 36 of halo 32 is displaced from implant edge 38 of extension 34 by a dimension approximately equal to u, which is about equal to the dimension of notch 28, and both implants are accomplished without any masking step between the implant steps. No masking step is required to achieve this separation because the two diffusions 32 and 34 are defined by different edges 23 and 27 of gate 20, and this is accomplished by providing a vertical implant and an angled implant with inverted T-shaped shaped gate 20.

Figure 3B:
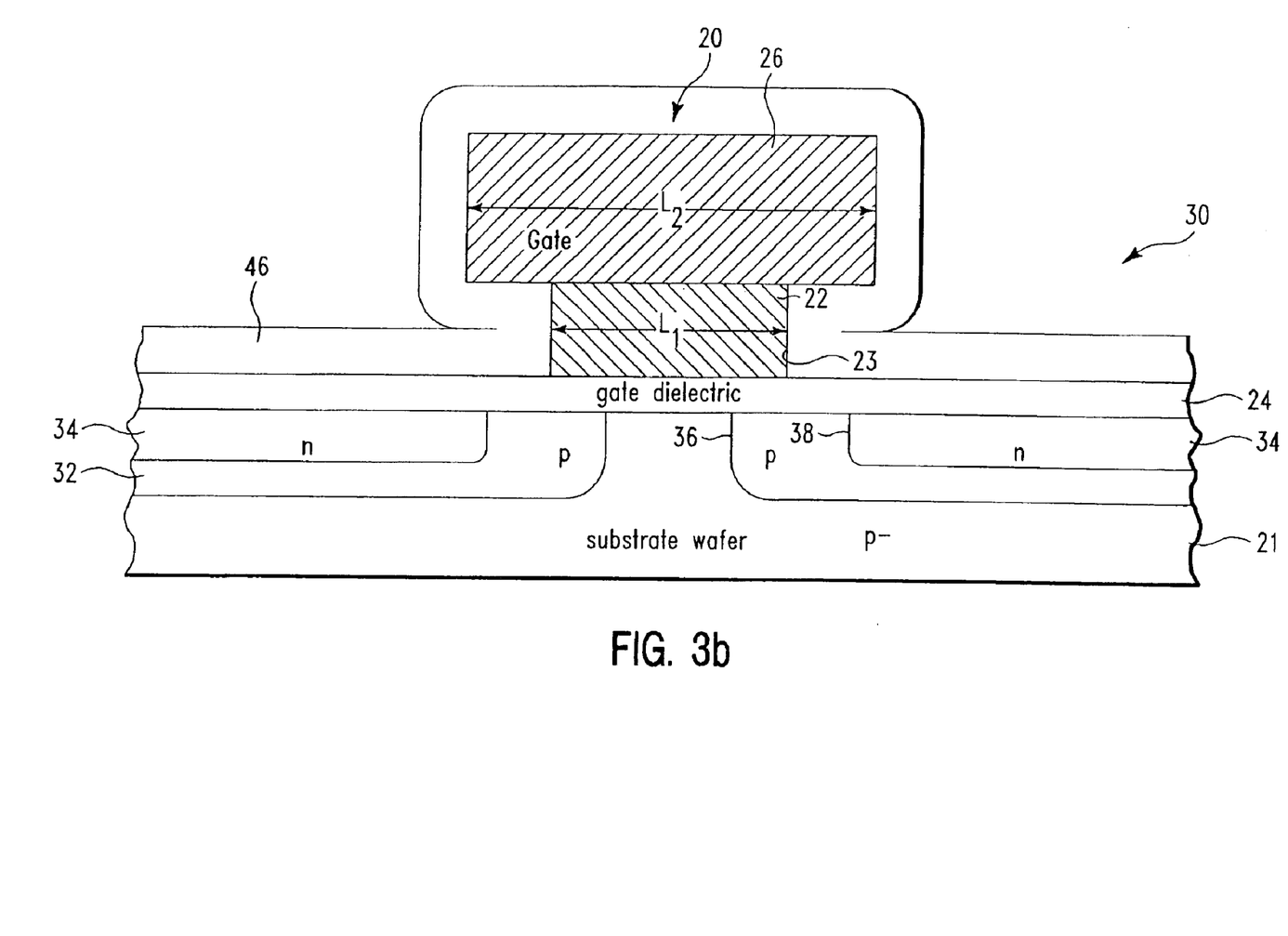
Figure 3C:
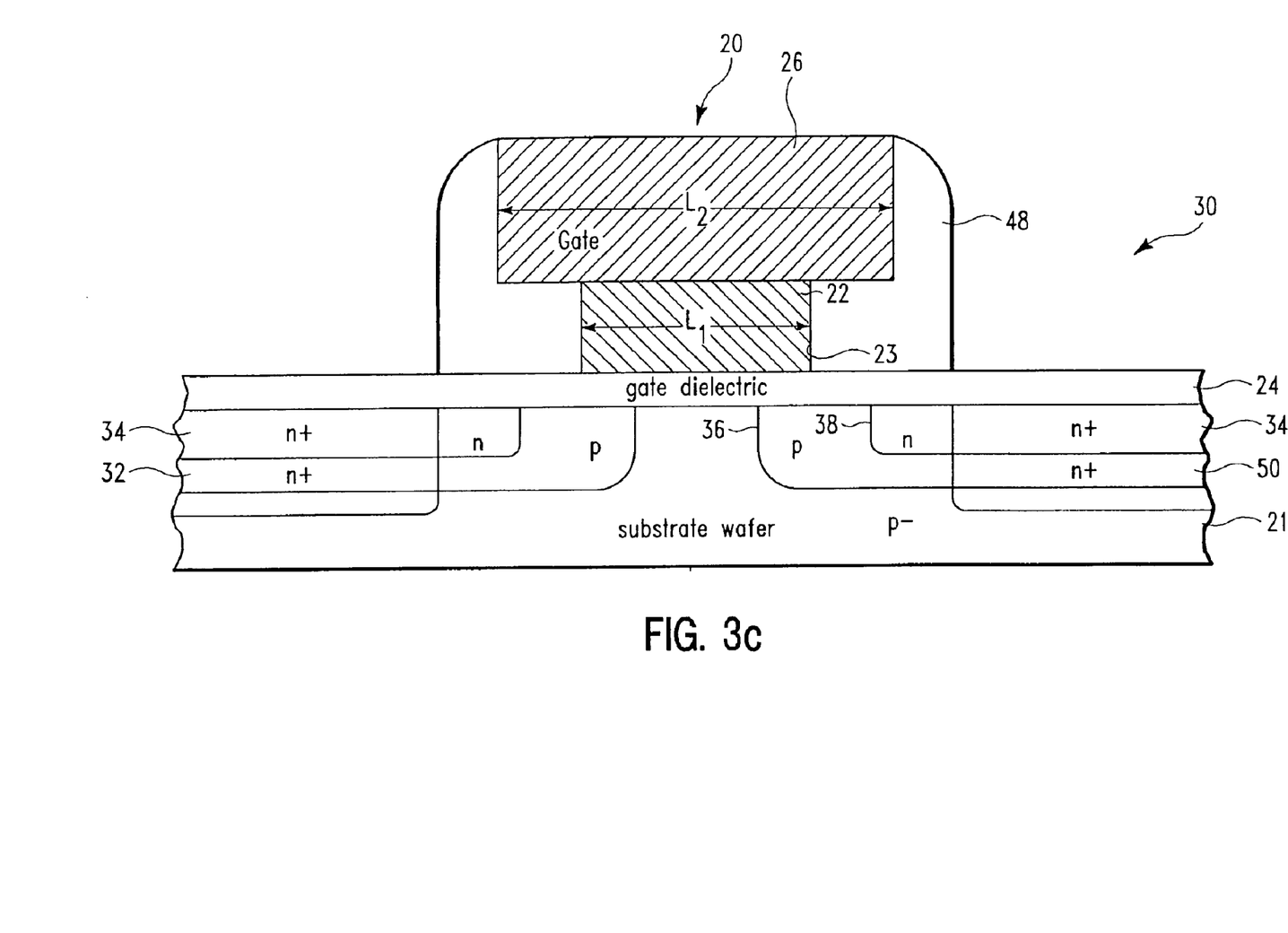
Figure 3D:
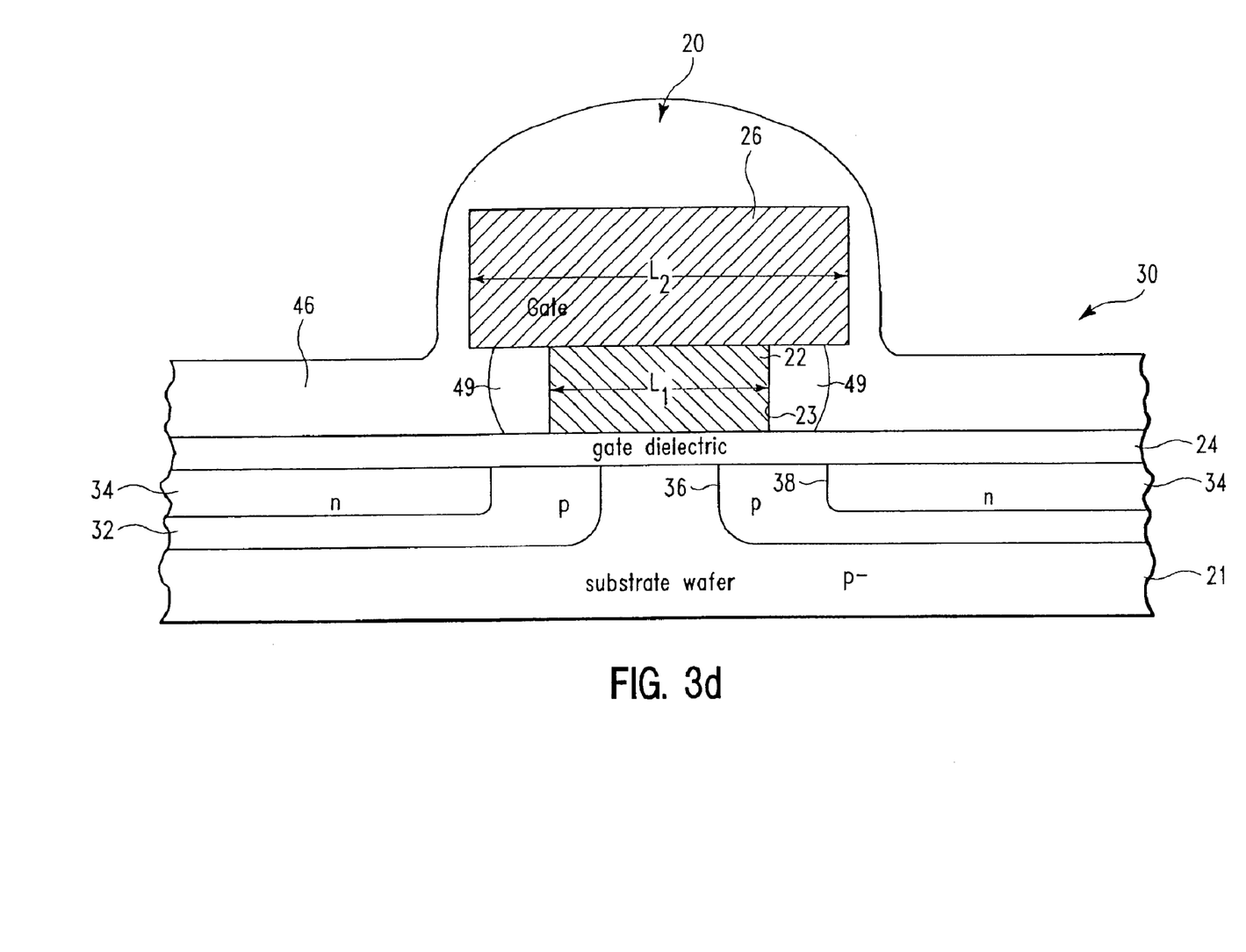
Figure 3E:
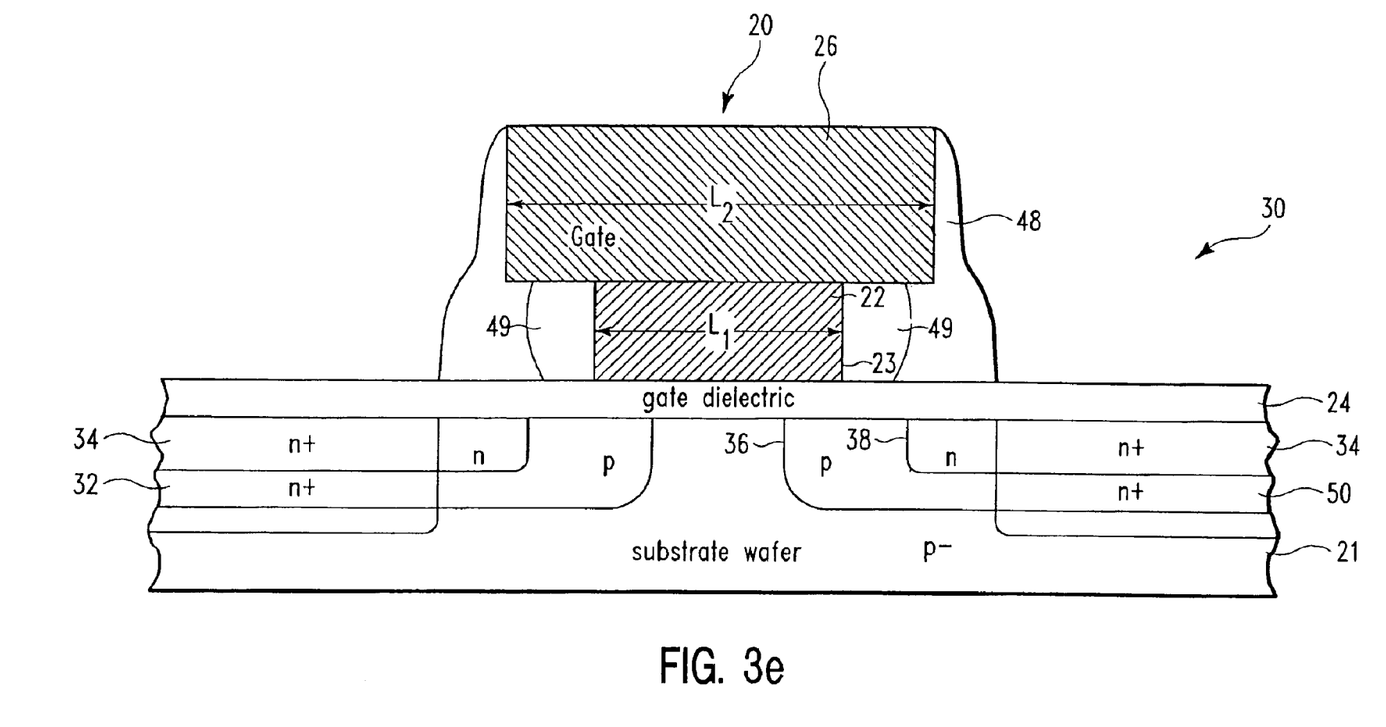

In the next step a layer of insulating material 46 is conformally deposited on all surfaces on wafer 21, as shown in FIG. 3b. Insulating material 46 is formed of a material such as silicon dioxide or silicon nitride. Then a directional etch is used to form sidewall spacers 48, as shown in FIG. 3c. Finally, source/drain 50 is implanted defined by spacers 48, as also shown in FIG. 3c. Alternatively, insulating material 46 can be non-conformally deposited so that an air gap 49 is left behind spacer 48 along the notched sidewall of first layer 56, as shown in FIG. 3d. A deposition process such as a plasma-enhanced chemical vapour deposition (PECVD) is known to be a more directional deposition process and will thus deposit a thicker film on a horizontal surface compared to a vertical surface. A directional etch is used to form sidewall spacers 48 with air gap 49 as shown in FIG. 3e. The resulting air gap 49 has a dielectric constant of about 1.0 while silicon dioxide sidewall spacers 48 have a dielectric constant of about 3.5. Air gap 49 reduces the effective dielectric constant of sidewall spacers 48 and thus helps to reduce overlap capacitance.

While T-shaped gate 20 permits separating halo and extension implants without adding a separate masking step the process described here also provides great advantage in allowing bottom portion 24 to be fabricated with a sub-minimum dimension length, substantially increasing device performance. Furthermore, the method of the present invention allows this shrinking of the gate length without increasing line width tolerance. Furthermore the T-shaped gate provides large area top part 26 that avoids increasing gate resistance when bottom part 24 is shrunk. Thus, performance is substantially improved without any negative effects.

Figure 4:
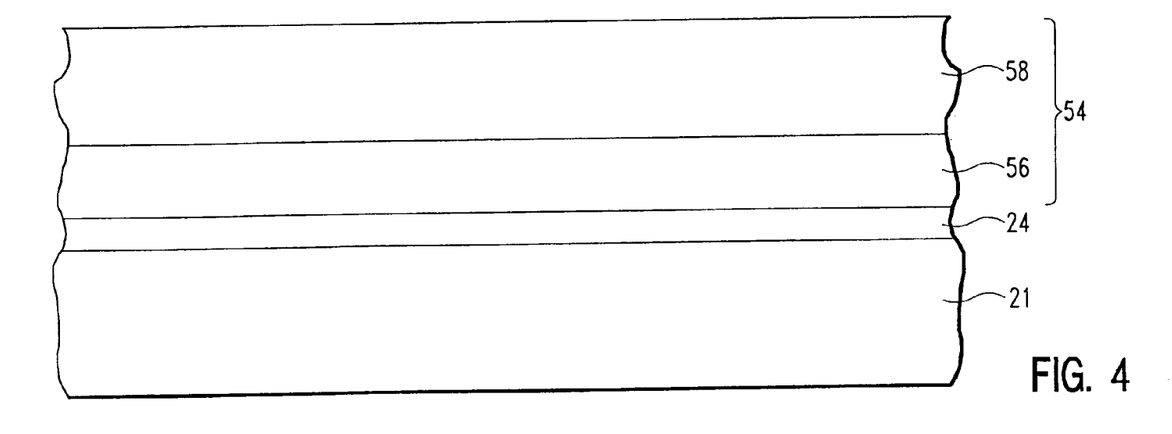
Figure 5:
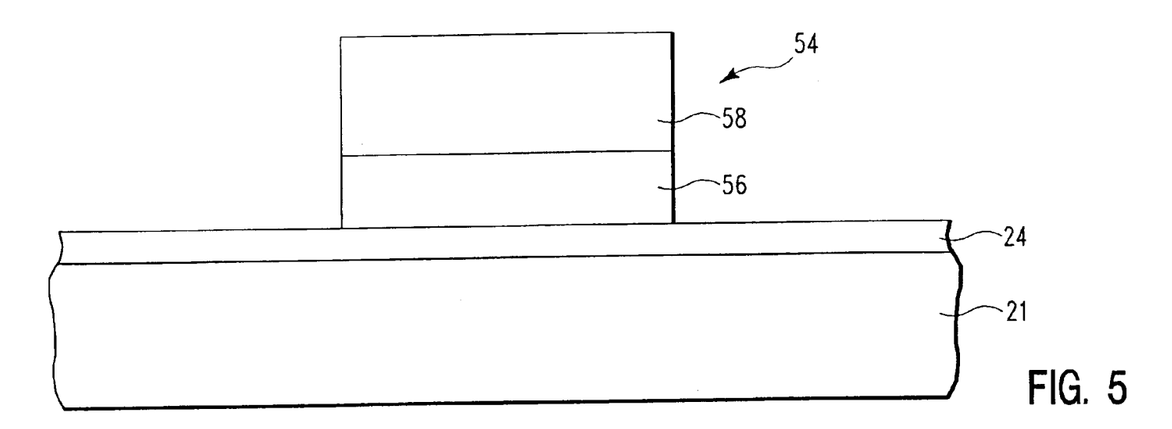

T-shaped gate 20 is formed by depositing two-layer structure 54 on gate dielectric 24 and on isolation (not shown) on wafer 21, as shown in FIG. 4. Two layer structure 54 includes a first layer, such as germanium layer 56 and a second layer, such as polysilicon layer 58. The two layers are selected from materials for which first layer 56 can be oxidized differently than second layer 58. Next, two layer structure 54 is photolithographically patterned and etched, as shown in FIG. 5, in which etched germanium layer 56 and polysilicon layer 58 have equal lengths and widths. The length or width may be the minimum dimension achievable with the photolithographic system.

Figure 6:
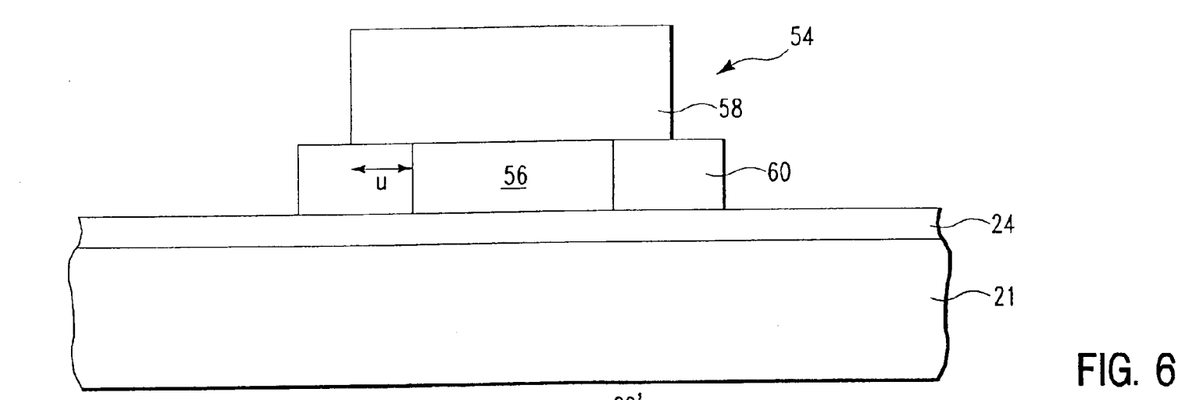

In the next step, two layer structure 54 is subjected to a chemical reaction step, such as an oxidation at about 500–600 C, as shown in FIG. 6. At this temperature, a germanium oxide 60 grows on exposed edges of germanium layer 56, as shown in FIG. 6. Polysilicon layer 58 will not significantly oxidize at this temperature. Germanium oxide 60 is grown to consume 7–13 nm (lateral extent u) of germanium layer 56. Then germanium oxide 60 is removed with a water rinse, providing notch 28 as shown in FIG. 3a. The oxidation step can be very tightly controlled to provide a very reproducible thickness of germanium that is consumed, and all of the oxide can be removed without further etching either the germanium or the polysilicon. Thus the oxidation and etch process provides a high level of control over the amount of germanium layer 56 that is removed, providing a tight tolerance on length or width of germanium layer 56. Germanium layer 56 thus has a dimension about 14 to about 26 nm less than polysilicon layer 58. Germanium layer 56 can now have a dimension that is about 10 to about 50% less than the minimum dimension of the photolithographic system being used while polysilicon layer 58 continues to have the minimum dimension.

In another embodiment, first layer 56 can consist of a germanium compound, $Ge_xSi_{1-x}$, where x is in the range of about 0.5 to about 1.0.

Other chemical reaction steps can be provided with good control as well. For example, first layer 56 may be polysilicon and second layer 58 may be a refractory metal. A thin layer of metal, such as platinum, titanium, tantalum, or cobalt, is conformally deposited along sidewalls of two gate layers 56, 58. The substrate is then heated so the thin metal reacts with polysilicon layer 56 to form a metal silicide along sidewall edges of first layer 56. Second layer 58, being a refractory metal, will not react. Then the silicide can be selectively etched without affecting the second layer to form notch 28.

Figure 7:
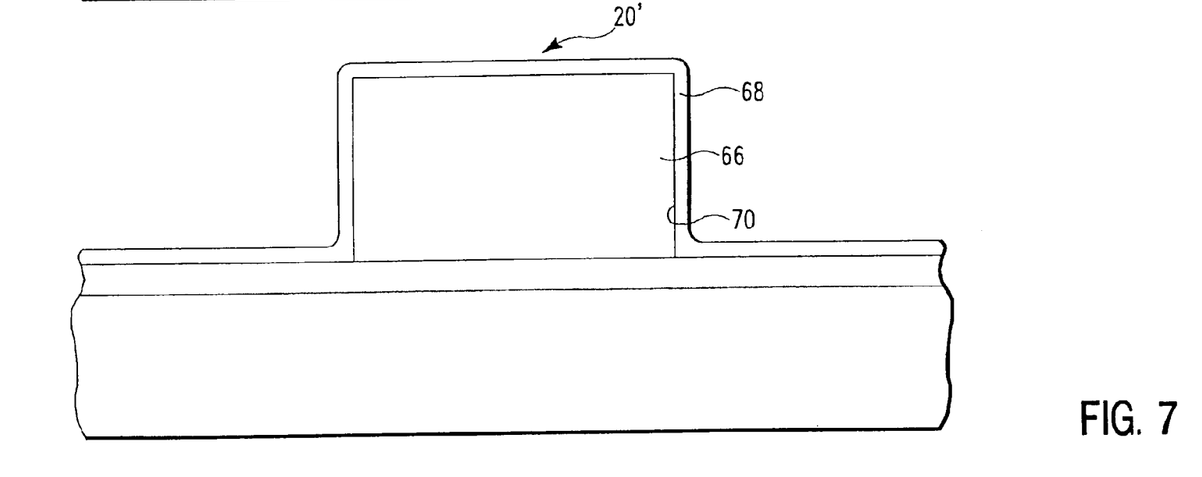
FIGS. 7–10 show cross sectional views illustrating another process of fabricating a T-shaped gate without a two-layered structure for the gate material.
Figure 8:
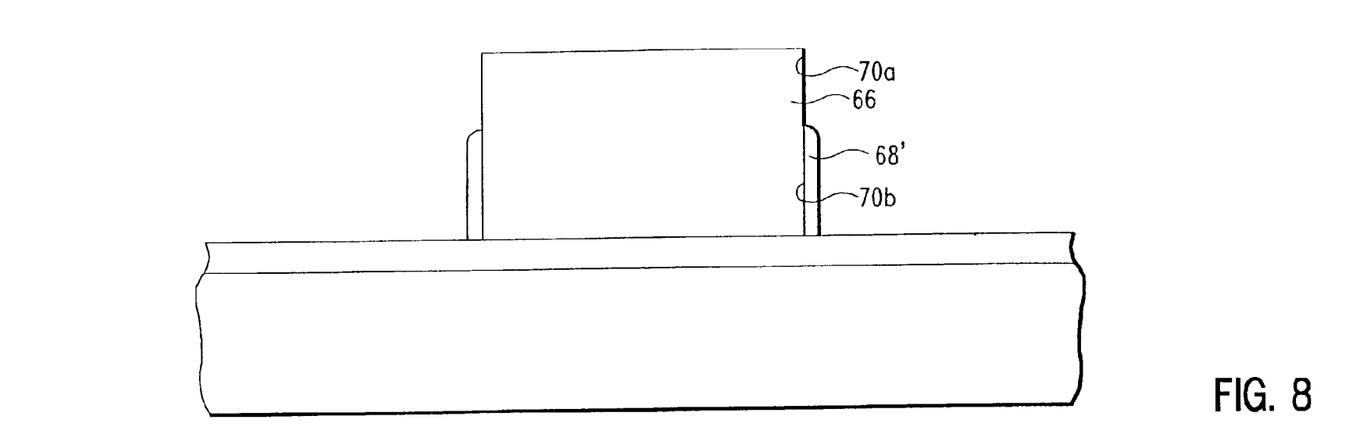
Figure 9:
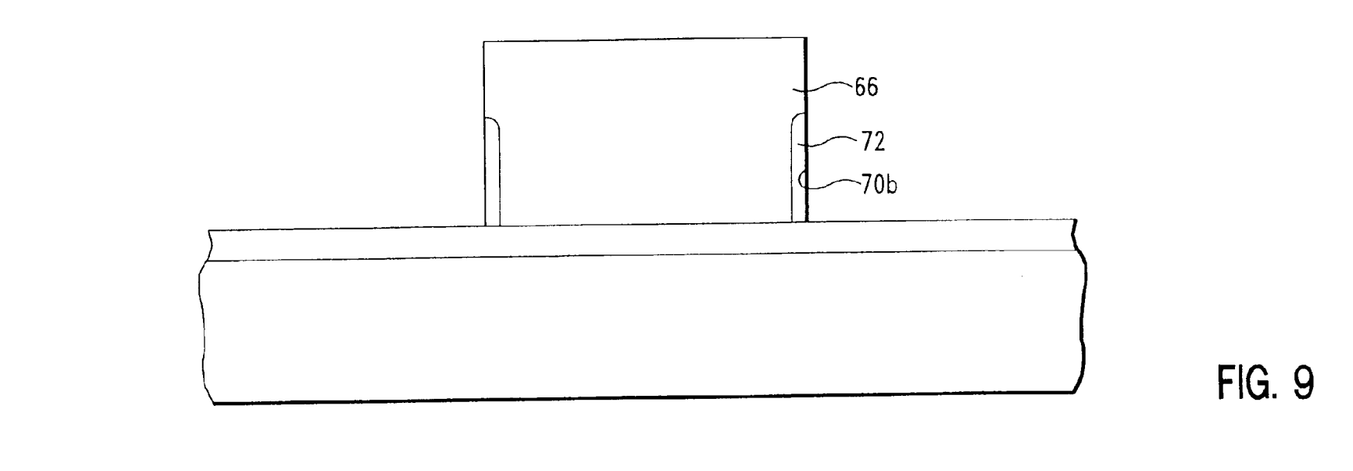
Figure 10:
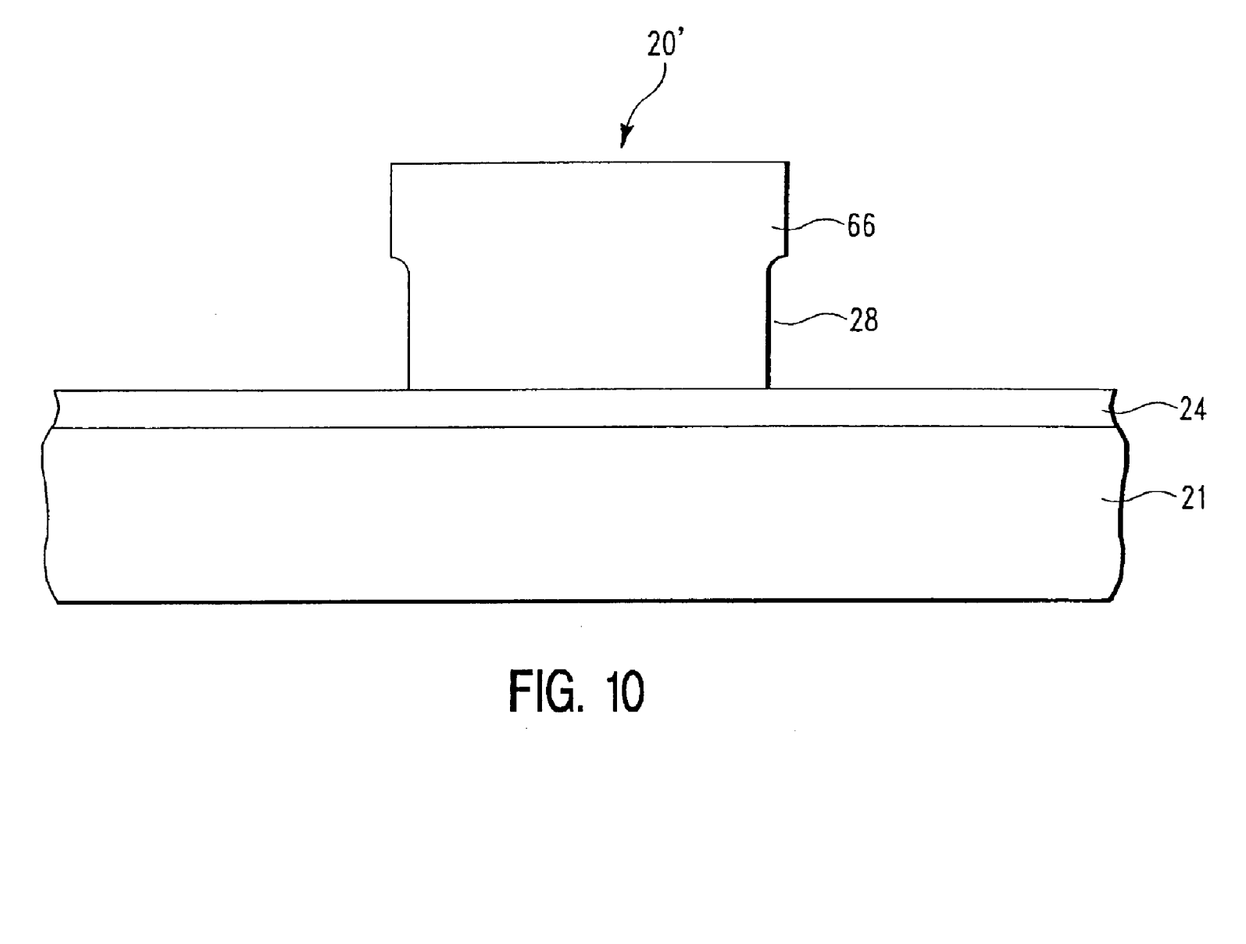

Alternatively, a single gate layer of polysilicon 66 can be used for gate 20'. FIG. 7 shows thin metal 68 deposited coating sidewalls 70 of gate polysilicon 66. FIG. 8 shows thin metal 68 is subjected to a directional etch to remove metal along horizontal surfaces and top portion 70a of sidewall 70 of gate polysilicon layer 66. Now substrate 21 is heated so remaining metal 68' reacts with polysilicon 66 to form metal silicide 72 exclusively along lower portion 70b of sidewall 70 that was coated by metal 68' as shown in FIG. 9. This silicide is then removed to form notch 28, as shown in FIG. 10. Metal silicide 72 such as cobalt silicide or titanium silicide can be wet etched in hydrogen peroxide or hot sulfuric/hydrogen peroxide mixtures.

T-shaped gate 20 formed by this process has substantial advantages over prior art gates. Since the lower portion of gate 20 determines its effective channel length, this selective oxidation and trimming of germanium layer 56 can provide a higher performance device than a device without trimming with tighter control than previous attempts to form a T-shaped gate. Longer or wider top polysilicon layer 58 can be used to provide higher conductivity for the entire gate conductor.

If desired, the gate conductor stack can be composed of a lower layer of germanium and an upper layer of silicon, with a graded layer of SiGe in between the two. This would provide a tapered profile of the final gate conductor structure, rather than a sharply discontinuous profile between the germanium and silicon films.

Other conductive materials can be provided for first layer 56 and second layer 58 in which there is selectivity for oxidation and etching of the oxide. For example, a refractory metal, such as tungsten, tantalum, molybdenum, or titanium, or a silicide, such as titanium silicide, cobalt silicide, or platinum silicide can be used for second layer 58. Polysilicon can then be used for first layer 56.

In another embodiment first layer 56 can be selectively etched of with respect to second layer 58 to provide T-shaped gate 20, eliminating the oxidation step. However, this is expected to provide somewhat less process control than providing the oxidation and then the etch step.

While several embodiments of the invention, together with modifications thereof, have been described in detail herein and illustrated in the accompanying drawings, it will be evident that various further modifications are possible to provide an FET with notched gate without departing from the scope of the invention. Nothing in the above specification is intended to limit the invention more narrowly than the appended claims. The examples given are intended only to be illustrative rather than exclusive.

What is claimed is:

1. An FET, comprising a gate, said gate comprising first conductive material and a second conductive material different from said first conductive material, said second conductive material on said first conductive material, wherein said second conductive material extends beyond said first conductive material to provide a T-shaped gate, a first diffusion region self-aligned to the first conductive material, a second diffusion region defined by said second conductive material, and a spacer along sidewalls of said second conductive material, wherein a third implant is defined by said spacer, and further wherein an air gap is left behind said spacer along a notched sidewall of said first conductive material.

2. The FET of claim 1, wherein said first conductive material is on a gate dielectric and said gate dielectric is on a substrate.

3. The FET of claim 1, wherein said second conductive material comprises polysilicon.

4. The FET of claim 1, wherein said second conductive material comprises a silicide.

5. The FET of claim 1, wherein a thickness of said second conductive material is greater than a thickness of said first conductive material.

6. The FET of claim 1, wherein said first diffusion and said second diffusion regions are laterally offset by a distance equal to about a given distance that said second conductive material extends beyond said first conductive material.

7. The FET of claim 1, wherein said first diffusion region comprises a first impurity having a first conductivity type and said second diffusion region comprises a second impurity having a second conductivity type.

8. The FET of claim 7, wherein said third implant comprises said second impurity.

9. The FET of claim 1, wherein said first material comprises a first semiconductor material.

10. The FET of claim 9, wherein said first semiconductor material comprises germanium.

11. The FET of claim 9, wherein said first semiconductor material comprises a germanium compound $Ge_xSi_{1-x}$, wherein x is in the range of about 0.5 to about 1.0.

12. The FET of claim 1, wherein said first conductive material comprises polysilicon.

13. The FET of claim 12, wherein said second conductive material comprises a refractory metal.

14. The FET of claim 13, wherein said second conductive material comprises tungsten, tantalum, molybdenum, or titanium.

15. An FET, comprising:

a gate disposed on a substrate, said gate comprising a lower portion having first sidewalls and an upper portion having second sidewalls, said first and second sidewalls being laterally offset;

spacers disposed on said second sidewalls and extending down to said substrate without contacting said first sidewalls to define an air gap therebetween;

a first implant disposed in said substrate and aligned to said first sidewalls; and a second implant disposed in said substrate and aligned to said second sidewalls.

16. The FET of claim 15, wherein said upper portion of said gate extends beyond said lower portion to provide a T-shaped gate.

17. The FET of claim 15, further comprising:

a third implant disposed in said substrate and aligned to said spacers.

18. The FET of claim 15, wherein said first implant comprises a first impurity having a first conductivity type and said second implant comprises a second impurity having a second conductivity type.

19. The FET of claim 15, wherein a thickness of said second sidewalls is greater than a thickness of said first sidewalls.

20. The FET of claim 15, wherein said first and second implant are offset by a distance equal to about said lateral offset of said first and second sidewalls.

* * * * *